US012451448B2

(12) United States Patent
Yuksel et al.

(10) Patent No.: US 12,451,448 B2
(45) Date of Patent: Oct. 21, 2025

(54) ELECTROMAGNETIC WAVEGUIDING THROUGH LIQUID COOLING CONDUIT

(71) Applicant: INTERNATIONAL BUSINESS MACHINES CORPORATION, Armonk, NY (US)

(72) Inventors: Anil Yuksel, Austin, TX (US); Jose A. Hejase, Pflugerville, TX (US); Junyan Tang, Austin, TX (US); Pavel Roy Paladhi, Pflugerville, TX (US); Joshua Myers, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 626 days.

(21) Appl. No.: 17/808,221

(22) Filed: Jun. 22, 2022

(65) Prior Publication Data

US 2023/0420394 A1      Dec. 28, 2023

(51) Int. Cl.
*H01L 23/66* (2006.01)
*H01L 23/473* (2006.01)
(Continued)

(52) U.S. Cl.
CPC .......... *H01L 23/66* (2013.01); *H01L 23/473* (2013.01); *H01P 3/16* (2013.01); *H01L 2223/6627* (2013.01)

(58) Field of Classification Search
CPC ... H01L 23/66; H01L 23/473; H01L 23/4332; H01L 23/4338; H01L 2225/1094; H01L 2225/06589; H01L 2223/6627; H01P 3/16
See application file for complete search history.

(56) References Cited

U.S. PATENT DOCUMENTS

| 7,663,064 B2 | 2/2010 | Dutta |
| 8,526,881 B2 | 9/2013 | Lee |

(Continued)

FOREIGN PATENT DOCUMENTS

| EP | 1361671 A1 * | 11/2003 | ............... H04B 3/52 |
| EP | 1361671 B1 | 11/2007 | |

(Continued)

OTHER PUBLICATIONS

Caporale et al., "Wireless Interconnects for 3D Network-on-Chip with Embedded Micro Thermofluidic Cooling Channels" (Year: 2015).*

(Continued)

*Primary Examiner* — Joshua Benitez Rosario
*Assistant Examiner* — Moataz Khalifa
(74) *Attorney, Agent, or Firm* — Jeffrey M. Ingalls (57) ABSTRACT

A multi-chip package structure is provided. The multi-chip package structure includes a first IC chip and a second IC chip, and a fluid conduit thermally coupled to the first IC chip and the second IC chip. The multi-chip package structure is configured to remove heat generated by at least one of the first IC chip and the second IC chip. The fluid conduit has a first end and a second end opposite to the first end. The multi-chip package structure also includes a first monopole feed connected between the first IC chip and the first end of the fluid conduit, and a second monopole feed connected between the second IC chip and the second end of the fluid conduit. The first monopole feed is configured to transmit an electromagnetic signal through the fluid conduit toward the second monopole feed and vice versa.

12 Claims, 4 Drawing Sheets

(51) Int. Cl.
*H01L 25/065* (2023.01)
*H01L 25/10* (2006.01)
*H01P 3/16* (2006.01)

(56) References Cited

U.S. PATENT DOCUMENTS

| | | | |
|---|---|---|---|
| 8,912,862 B2* | 12/2014 | Biran | H01P 5/08 333/33 |
| 9,303,523 B2 | 4/2016 | Rodriguez | |
| 9,304,533 B2 | 4/2016 | Gusat | |
| 9,398,730 B2 | 7/2016 | Gusat | |
| 9,893,400 B2 | 2/2018 | Hejase et al. | |
| 10,411,756 B2 | 9/2019 | Snyder | |
| 2006/0140630 A1* | 6/2006 | Popovich | F28F 1/405 398/58 |
| 2008/0093731 A1 | 4/2008 | Heyen | |
| 2013/0315782 A1 | 11/2013 | Huang | |
| 2014/0034104 A1 | 2/2014 | O'Donnell et al. | |
| 2018/0108971 A1 | 4/2018 | Connor et al. | |
| 2018/0116076 A1 | 4/2018 | Dede et al. | |
| 2019/0287908 A1* | 9/2019 | Dogiamis | H01P 3/121 |
| 2020/0098669 A1* | 3/2020 | Elsherbini | H01L 25/18 |
| 2020/0409398 A1 | 12/2020 | Gebrehiwot et al. | |

FOREIGN PATENT DOCUMENTS

| | | | |
|---|---|---|---|
| EP | 4544593 A1 | 4/2025 | |
| TW | 200504893 A | 2/2005 | |
| TW | 200903006 A | 1/2009 | |
| TW | 201319563 A | 5/2013 | |
| TW | I845253 B | 6/2024 | |
| WO | 2023/248029 A1 | 12/2023 | |

OTHER PUBLICATIONS

Kelly et al., "Dielectric Fluids for the Direct Forced Convection Cooling of Power Electronics," 2021 20th IEEE Intersociety Conference on Thermal and Thermomechanical Phenomena in Electronic Systems, Downloaded from the Internet Mar. 28, 2022, 5 pages.

3M, "3M Thermal Management Fluids", 2020, 8 Pages, https://multimedia.3m.com/mws/media/5698600/3mtm-thermal-management-fluids-for-military-aerospace-apps.pdf.

Unknown, "Liquids—Dielectric Constants", Engineering Toolbox, 2020, 13 Pages, https://www.engineeringtoolbox.com/liquid-dielectric-constants-d_1263.html.

Unknown, "PSF-100cSt Dielectric Silicone Fluid", ClearCo, 2020, 1 Page, https://www.clearcoproducts.com/pdf/dielectric-fluids/NP-PSF-100cSt%20Dielectric%20Silicone%20Fluid.pdf.

Unknown, "PSF-20cSt Dielectric Silicone Fluid", ClearCo, 2020, 1 Page, https://www.clearcoproducts.com/pdf/dielectric-fluids/NP-PSF-20cSt%20Dielectric%20Silicone%20Fluid.pdf.

Unknown, "PSF-50cSt Dielectric Silicone Fluid", ClearCo, 2020, 1 Page, https://www.clearcoproducts.com/pdf/dielectric-fluids/NP-PSF-50cSt%20Dielectric%20Silicone%20Fluid.pdf.

Unknown, "Water—Thermophysical Properties", Engineering Toolbox, 2020, 11 Pages, https://www.engineeringtoolbox.com/water-thermal-properties-d_162.html.

International Searching Authority, Notification of Transmittal of the International Search Report and the Written Opinion of the International Searching Authority, Oct. 13, 2023, 12 pages, International Application No. PCT/IB2023/055478.

* cited by examiner

ELECTROMAGNETIC WAVEGUIDING THROUGH LIQUID COOLING CONDUIT

BACKGROUND

The present disclosure relates to multi-chip package structures, and in particular to liquid cooling of different components and high-speed data transmission between different integrated circuit (IC) structures. When constructing multi-chip package structures, it may be desirable to implement interconnecting structures that enable communication between package components such as IC chips. Current server bus communication trends are seeing an increase in speed to accommodate increased data bandwidth demands. Certain structures for transmitting signals between package components include, for example, planar transmission lines such as microstrips, strip lines, and coplanar waveguides transmission lines. There may be a need to develop data transmission methods at ever higher bandwidths.

In addition to the need to transmit data between different package components, heat is generated in, for example, the IC processing chips. Air and liquid cooling techniques have been applied to cool servers that have high-power devices such as CPUs and graphics processing units (GPUs).

Therefore, in addition to effectively transmitting data at high speeds, it may also be desirable to develop effective cooling systems for a multi-chip package structure.

SUMMARY

Embodiments of the present disclosure relate to a multi-chip package structure. The multi-chip package structure includes a first IC chip and a second IC chip, and a fluid conduit thermally coupled to the first IC chip and the second IC chip. The multi-chip package structure is configured to remove heat generated by at least one of the first IC chip and the second IC chip. The fluid conduit has a first end and a second end opposite to the first end. The multi-chip package structure also includes a first monopole feed connected between the first IC chip and the first end of the fluid conduit, and a second monopole feed connected between the second IC chip and the second end of the fluid conduit. The first monopole feed is configured to transmit an electromagnetic signal through the fluid conduit.

Embodiments of the present disclosure relate to a liquid cooling device for a multi-chip package structure. The liquid cooling device includes a fluid conduit configured to remove heat generated by at least one of a first IC chip and a second IC chip, the fluid conduit having a first end and a second end opposite to the first end, a first monopole feed connected at the first end of the fluid conduit, and a second monopole feed connected at the second end of the fluid conduit. The first monopole feed is configured to transmit an electromagnetic signal through the fluid conduit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

The present disclosure relates to multi-chip package structures, and in particular, to a liquid cooling of different components and high-speed data transmission between different integrated circuit (IC) structures. When constructing multi-chip package structures, it may be desirable to implement interconnecting structures that enable communication between package components such as IC chips. Current server bus communication trends are seeing an increase in speed to accommodate increased data bandwidth demands. Certain structures for transmitting signals between package components include, for example, planar transmission lines such as microstrips, strip lines, and coplanar waveguides transmission lines. Technologies have been developed/researched to address the issue of increased bandwidth demands, such as electro-optics (active); substrate integrated waveguides (passive); dielectric waveguides (passive); and discrete waveguides (passive). The electro-optic implementation may have higher costs, increased power consumption (due to associated active circuitry), and may require a greater amount of calibration. In general, substrate integrated waveguides (SIW) are waveguides formed within a printed circuit board (PCB) by using ground vias to guide a high-speed electromagnetic signal. Rectangular or circular waveguides, formed with metal walls, may function as good signal carriers at high speeds.

However, while certain of these data transmission lines may be sufficient for transmitting lower frequency signals, signal attenuation and frequency dispersion occur when using such planar transmission lines to transmit high-frequency signals that are demanded by today's industry standards. Indeed, the ability to implement high-speed communication links in package structures that are capable of transmitting at data rates in the range of Gbps (Gigabits per second) to hundreds of Gbps may be essential for various types of systems designed to operate at millimeter-wave frequencies to terahertz frequencies, such as radar, imaging, and computer server systems. Thus, there may be a need to develop data transmission methods at ever higher bandwidths.

In addition to the need to transmit data at high speed between different package components, heat is generated, for example, in the IC processing chips. Air and liquid cooling systems have been applied to cool traditional servers which have high-power devices such as CPUs and graphics processing units (GPUs). Due to the dramatic increase of such high power consumption from these components, air or liquid cooling systems are commonly utilized to cool electronic components such as computer processors and memory during operation. Due to the higher specific heats of common liquids such as water, liquid cooling systems perform more effectively and with greater efficiency than air-based cooling systems. In liquid cooling systems, an input of cold liquid is passed over hot components (or heat sinks connected to hot components) to dissipate the heat from the components into the cold liquid. The transfer of heat from the hot components into the cold liquid causes the temperature of the liquid to rise, and the liquid must be cooled before it can be utilized again to cool components. Heat exchangers are often utilized to cool the liquid back down before it can be used to cool components again. Heat exchangers allow for some of the heat of the liquid to be dissipated into a secondary medium such as another liquid or air. Thermal cooling tubes may be used to transmit liquids through the cooling system to help dissipate heat generated from high-power devices such as CPUs. Thermal cooling tubes are typically composed of a conductive outer shell that could be of a circular or rectangular cross-section. These tubes carry cooling liquids between different processing units within a server system in order to achieve thermal management. Therefore, in addition to effectively transmitting data at high speeds, it may also be desirable to develop effective cooling systems for a multi-chip package structure.

Regarding data transmission between different CPUs, as discussed above, in certain instances, high-speed communication busses exist between the processing units to achieve server system functionality. However, the high-speed bus channels typically exist within printed circuit boards, cables, and connectors and thus take up valuable space within the server system. In order to solve existing technology's higher speed limitations and minimize space consumption, the present embodiments provide a liquid cooling waveguide tube having a secondary purpose of data signal transmission between different processing units or IC chips.

Embodiments will now be discussed in further detail with regard to multi-chip package structures having waveguides that are configured to enable high data rate communication between package components (e.g., data rates in the range of Gbps to hundreds of Gbps) for use in systems having operating frequencies in the range of millimeter-wave frequencies to terahertz frequencies and higher, for example. These waveguides are integrated within a liquid cooling pipe of a cooling system. Thus, the liquid cooling pipes of the present embodiments have dual purposes: (1) to transmit data; and (2) to circulate cooling fluid.

It is to be understood that the various layers and/or components are shown in the accompanying drawings are not drawn to scale, and that one or more layers and/or components of a type commonly used in constructing semiconductor package structures with integrated circuit chips may not be explicitly shown in a given drawing. This does not imply that the layers and/or components not explicitly shown are omitted from the actual package structures. Moreover, the same or similar reference numbers used throughout the drawings are used to denote the same or similar features, elements, or structures, and thus, a detailed explanation of the same or similar features, elements, or structures will not be repeated for each of the drawings.

Figure 1:
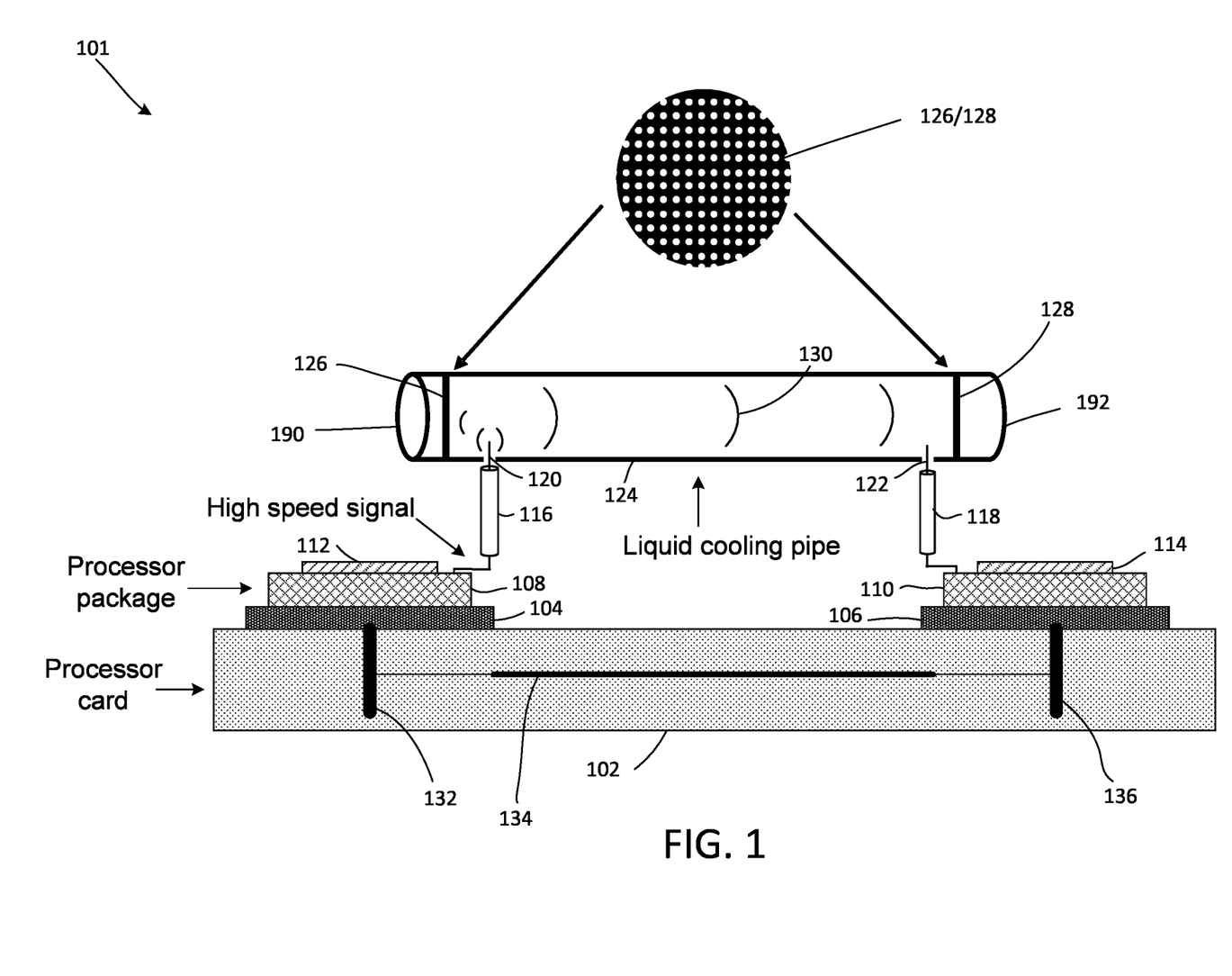
FIG. 1 is a cross-sectional schematic view of a multi-chip package structure including a liquid cooling pipe waveguide, according to embodiments.

FIG. 1 schematically illustrates a multi-chip package structure 101 having a liquid cooling pipe waveguide 124 (or liquid cooling pipe, or waveguide, or liquid cooling device) according to embodiments. In particular, FIG. 1 is a schematic cross-sectional view of a multi-chip package structure 101 comprising a processor card 102 (or motherboard). In general, the processor card 102 may include a plurality of layers such as signal layers and voltage supply layers. The processor card 102 may include a plurality of different processor packages, such as the first processor package 108 and the second processor package 110. The first processor package 108 may be connected to the processor card 102 through a first connector 104, and the second processor package 110 may be connected to the processor card 102 through a second connector 106. It should be appreciated that there may be more than two processor packages connected to the processor card 102 and the liquid cooling pipe waveguide 124. Moreover, it should be appreciated that the first connector 104 and the second connector 106 may be considered more generally to be any structure that is suitable to physically and electrically connect the first processor package 108 and second processor package 110, respectively, to the processor card 102.

As shown in FIG. 1, a first IC chip 112 (or first processor) is mounted on the first processor package 108, and a second IC chip 114 is mounted on the second processor package 110. In certain examples, the first IC chip 112 and second IC chip 114 may be electrically and mechanically connected to the first processor package 108 and second processor package 110, respectively, by flip-chip mounting the active (front side) surface of the first and second IC chips to a first surface of the processor packaging using, for example, an array of solder ball controlled collapse chip connections (C4), or other similar techniques. Moreover, the first processor package 108 and second processor package 110 may be electrically and mechanically connected to the processor card 102 using, for example, an array of BGA connections or other similar techniques, and these components may be included in the first connector 104 and second connector 106, respectively. The BGA connections may be formed between bonding/contact pads and wiring patterns of a patterned metallization layer formed on a surface of the processor card 102, and corresponding bonding/contact pads and wiring patterns of a patterned metallization layer formed on the first processor package 108 and the second processor package 110.

In general, the first IC chip 112 and the second IC chip 114 may include any suitable number of layers, such as a bulk substrate layer (not shown), an insulating layer (not shown), an active layer (not shown), and a back-end-of-line (BEOL) structure (not shown). In one embodiment, the first IC chip 112 and the second IC chip 114 are SOI (silicon-on-insulator) structures, wherein the insulating layers are buried oxide layers formed on bulk silicon substrates and wherein the active layers are thin layers of silicon formed on the buried oxide layers, wherein active devices are formed in the active silicon layers. In particular, the first IC chip 112 and the second IC chip 114 comprise active circuitry and electronic components formed in the respective active silicon layers, wherein the types of circuits and electronic components that are implemented will depend on the given application.

In certain embodiments, in addition to the liquid cooling pipe waveguide 124, there may be a secondary integrated waveguide in the processor card 102. The secondary integrated waveguide may include a first via 132 (or conductive cylinder, for example) and a second via 136 extending through multiple printed circuit board (PCB) layers of the processor card 102. The first via 132 may be connected to the second via 136 with a stripline 134 type of transmission line, for example. In certain examples, the first via 132 and second via 136 are metallic posts that are formed by drilling or etching an array of via holes through the processor card 102 and then plating or otherwise filling the via holes with a metallic material such as copper. In an example, the stripline 134 transmission line comprises a signal line formed on one metallization level, which is disposed between two ground elements formed by ground planes of adjacent metallization levels. The secondary integrated waveguide provides a communication channel that allows the first IC chip 112 and the second IC chip 114 to communicate at high-speed data rates (e.g., data rates in the range of Gbps to hundreds of Gbps). Although one integrated waveguide structure is shown in FIG. 1, the processor card 102 can be fabricated with two or more secondary integrated waveguide structures to enable high-speed multi-channel communication between the first and second IC chips. Moreover, although two IC chips are shown in FIG. 1 connected to the processor card 102, the multi-chip package structure 101 can have three or more IC chips flip-chip bonded to the processor card 102 with multiple secondary integrated waveguide structures implemented therein to supplement the communication between all IC chips in the multi-chip package structure 101 (i.e., in addition to the data communication achieved by the liquid cooling pipe waveguide 124). It should be appreciated that in certain embodiments, the data transmission between the first IC chip 112 and the second IC chip 114 is accomplished solely in the liquid cooling pipe waveguide 124 without the need for a secondary integrated waveguide in the processor card 102.

As also shown in FIG. 1, the first IC chip 112 and the second IP chip 114 are connected from the first processor package 108 and the second processor package 110 to the liquid cooling pipe waveguide 124 (or communication bus) through a first monopole feed 116 and a second monopole feed 118, respectively. The first monopole feed 116 includes a first signal carrying wire 120 that extends into the liquid cooling pipe waveguide 124 at a first end 190 of the liquid cooling pipe waveguide 124 for high-speed signal transmission (e.g., a ¼ λ, feed line). Similarly, the second monopole feed 118 includes a second signal carrying wire 122 that extends into the liquid cooling pipe waveguide 124 at a second end 192 of the liquid cooling pipe waveguide 124. The liquid cooling pipe waveguide 124 may have any suitable cross-sectional profile, such as circular, square or rectangular, etc.

As shown in FIG. 1, a first mesh signal reflector 126 is positioned at the first end 190 of the liquid cooling pipe waveguide 124, and a second mesh signal reflector 128 is positioned at the second end 192 of the liquid cooling pipe waveguide 124. In certain examples, the cross-sectional shape (shown at the top of FIG. 1) of the mesh signal reflectors is the same as the cross-sectional shape of the liquid cooling pipe waveguide 124. In the example shown in FIG. 1, this cross-sectional shape is circular. The high-speed signal 130 is transmitted (or emitted) from the first signal carrying wire 120 at the first end 190 of the liquid cooling pipe waveguide 124 to the second signal carrying wire 122 at the second end 192 of the liquid cooling pipe waveguide 124. In certain examples, the liquid cooling pipe waveguide 124 is comprised of one or more metals and functions as a waveguide.

The liquid cooling pipe waveguide 124 also functions as a fluid (e.g., liquid) conduit (the overall flow of the liquid relative to the component parts is discussed in further detail below with respect to FIG. 3). As discussed in further detail below with regard to FIG. 3, the liquid cooling pipe waveguide 124 connects to a heat sink 160 that is connected to the first IC chips 112 and the second IC chip 114 to remove the heat generated in the IC chips. It should be appreciated that the fluid may flow in either direction through the liquid cooling pipe waveguide 124. Moreover, it should be appreciated that the signal 130 may also travel in either direction (i.e., from the first end 190 to the second end 192, or from the second end 192 to the first end 190 of the liquid cooling pipe waveguide 124).

As shown in FIG. 1, in the liquid cooling pipe waveguide 124, when the signal is launched from the first signal carrying wire 120 (or the second signal carrying wire 122) at the correct frequency (e.g., a ¼ λ feedline), the signal 130 will have the correct propagating mode through the liquid cooling pipe waveguide 124. In certain examples, the first signal carrying wire 120 will be inserted into the liquid cooling pipe waveguide 124 at a specified distance from the first mesh signal reflector 126 to ensure the correct signal propagation mode. Also, the first mesh signal reflector 126 and the second mesh signal reflector 128 may have a designated reflective property to ensure the correct signal propagation mode. Thus, the mesh signal reflectors are configured to direct electromagnetic waves in a given direction while still allowing fluid to flow therethrough. In one example, as shown in FIG. 1, when the signal 130 is transmitted from the first end 190 to the second end 192, the first monopole feed 116 functions as a signal transmitter, and the second monopole feed 118 functions as a signal receiver. In another example, when the signal 130 is transmitted from the second end 192 to the first end 190, the first monopole feed 116 functions as a signal receiver and the second monopole feed 118 functions as a signal transmitter.

Figure 2:
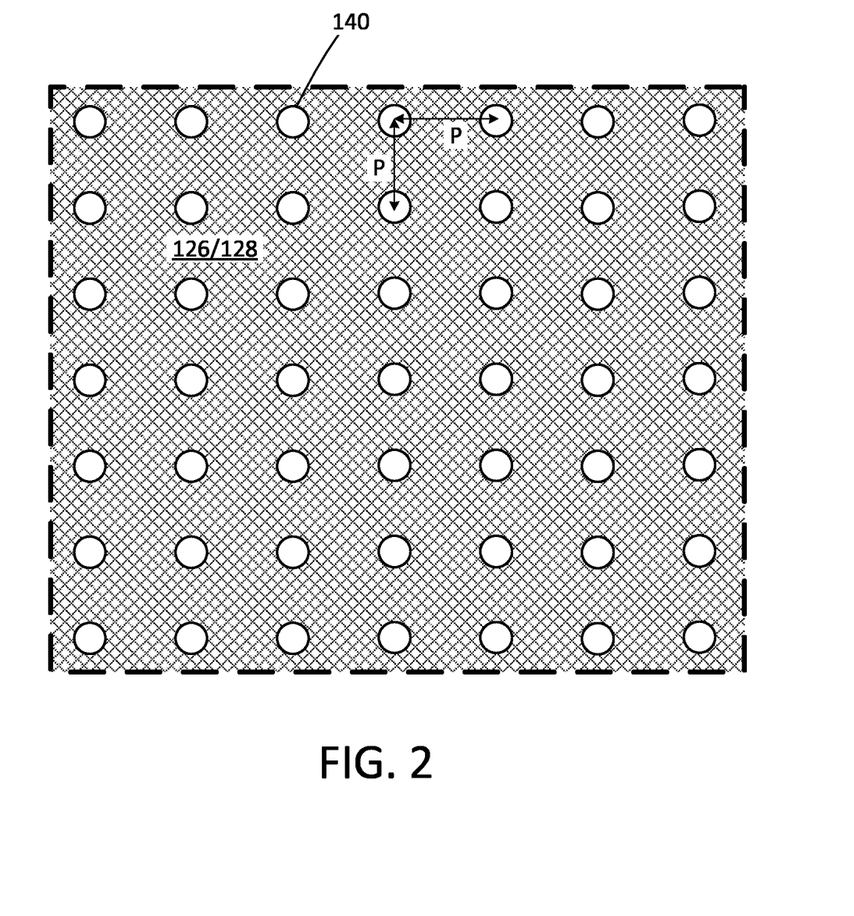
FIG. 2 is an enlarged partial view of the mesh signal reflector shown in FIG. 1, according to embodiments.

Referring now to FIG. 2, this figure shows an enlarged partial view of the first and second mesh signal reflectors 126/128 shown in FIG. 1, according to embodiments. As shown in FIG. 2, the mesh signal reflector 126/128 is configured as a metal plate with a plurality of holes 140 spaced periodically throughout. In general, the holes 140 are sized to correspond with whatever frequency range is being used for the signal 130 of the particular application. In certain examples, the holes 140 are less than about 1 mm. In certain examples, the holes 140 are periodically spaced at an even pitch P, and are sized to allow liquid flow through tube, but still reflect radiation from the antenna (or the first signal carrying wire 120 or second signal carrying wire 122). In certain examples, the hole 140 diameter is significantly smaller than the signal 130 wavelength (i.e., about ¹⁄₁₀ the size or less) in order to prevent the wave (or signal 130) from passing through the hole 140 (i.e., while still allowing the cooling liquid to pass through). In the example shown in FIG. 2, the holes are arranged in a row/column configuration. However, it should be appreciated that any other suitable arrangement or pattern of holes may be used, such as in a hexagonal or diamond pattern, provided that the holes prevent the signal 130 from passing through.

In certain examples, a liquid coolant is circulated through the liquid cooling pipe waveguide 124. The liquid coolant may have certain dielectric properties which may aid in determining the wavelength of the propagating signal 130. For example, if the dielectric properties of the liquid coolant are higher, the wavelength of the signal 130 becomes smaller. Conversely, if the dielectric properties (i.e., the dielectric constant) of the liquid coolant are lower, the wavelength of the signal 130 becomes larger. Liquid coolants available with varying dielectric constants, e.g., FC-4X series materials with a dielectric constant dk<2, PSF-series with typically dk>2.5. As an example, the free space wavelength for 100 GHz is 3 mm, whereas in a dielectric medium of dk 2.5, the wavelength contracts to 1.9 mm.

Figure 3:
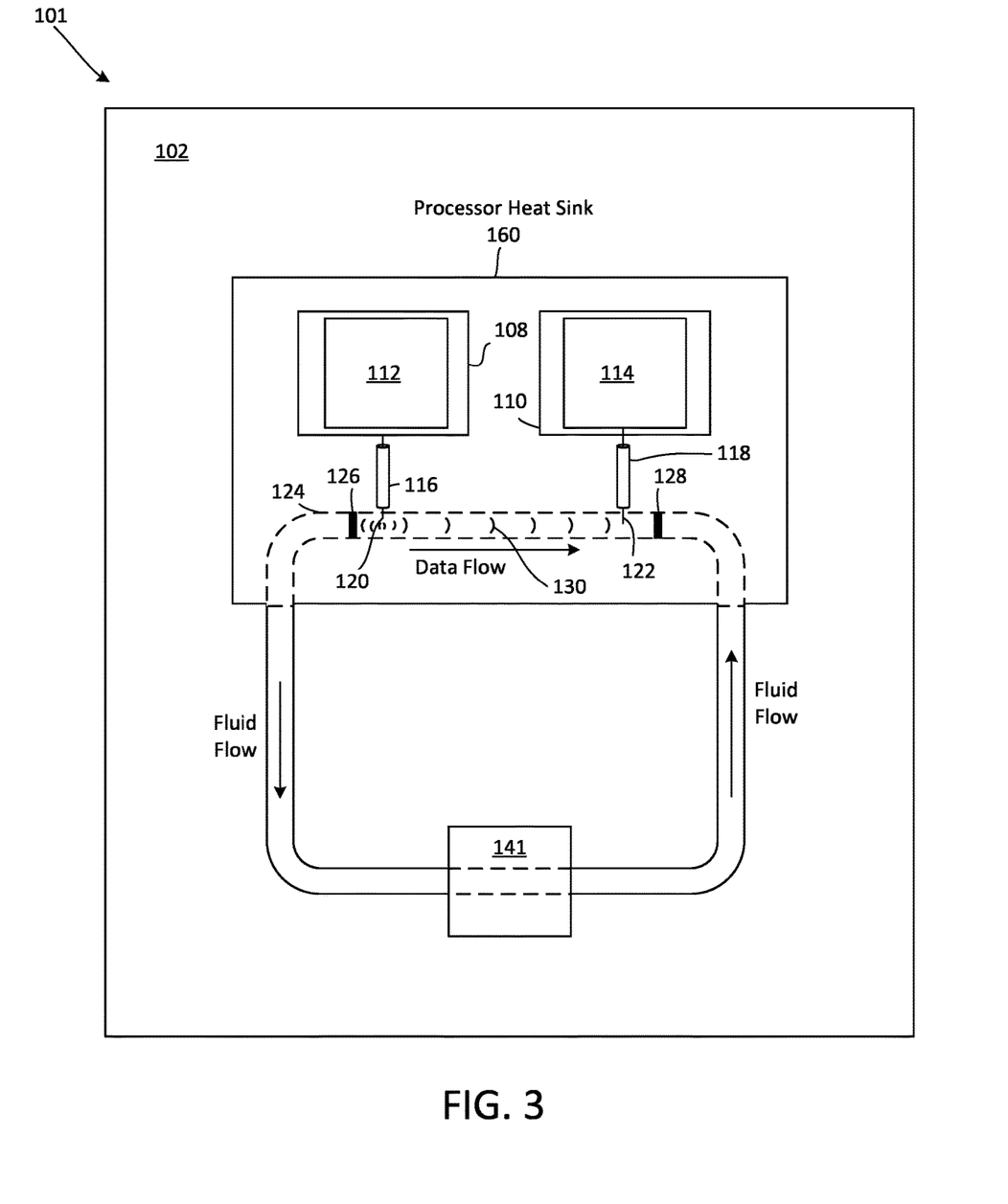
FIG. 3 is a schematic view of a multi-chip package structure illustrating the combination of data flow and coolant flow within a liquid cooling waveguide pipe, according to embodiments.

FIG. 3 is a schematic view of a multi-chip package structure illustrating the combination of data flow and coolant flow within a liquid cooling pipe, according to embodiments. As shown in FIG. 3, an example multi-chip package structure 101 is shown. The processor card 102 (or motherboard) includes the first processor package 108 and the first IC chip 112, and includes the second processor package 110 and the second IC chip 114, similar to the components shown in FIG. 1. FIG. 3 includes a processor heat sink 160, which generically illustrates a component that is capable of routing excess heat produced in the first IC chip 112 and the second IC chip 114 to the fluid flowing through the liquid cooling pipe waveguide 124. It should be appreciated that the location or size of the processor heat sink 160 does not have to be as shown in FIG. 3, and the illustration is merely one example configuration. FIG. 3 also illustrates generically a heat exchanger 141 that interacts with the fluid flowing through the liquid cooling pipe waveguide 124 and is capable of cooling the heated liquid. Although in FIG. 3, the heat exchanger 141 is located somewhere on the processor card 102, it should be appreciated that this component may be location in any suitable location. Thus, FIG. 3 illustrates that the liquid cooling pipe waveguide 124 has a dual functionality of heat dissipation and data transmission, thus improving data transmission speed issues and minimizing the amount of space that may need to be consumed. As discussed above with respect to FIG. 1, the fluid flow and the signal 130 transmission may flow in either direction.

Figure 4:
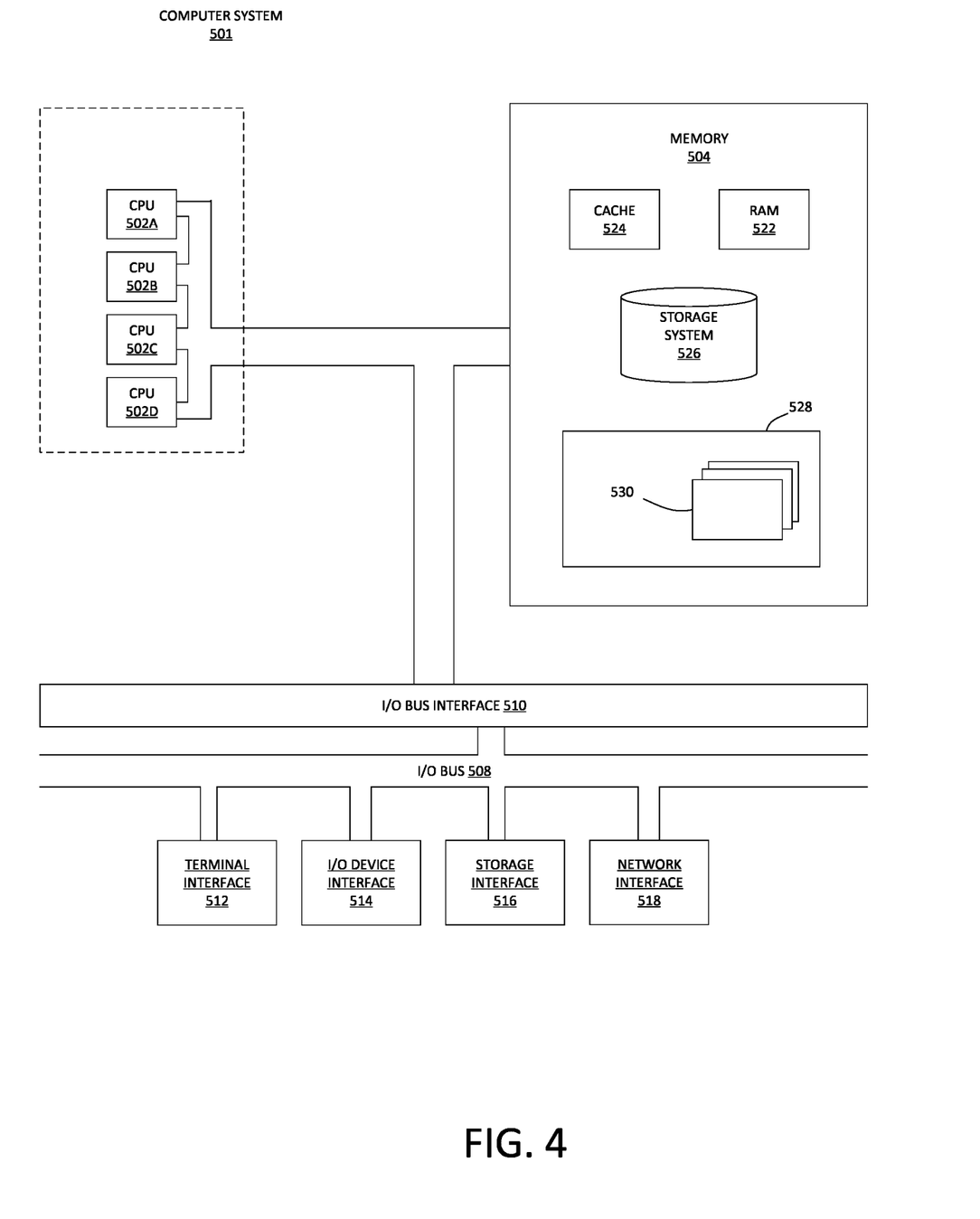
FIG. 4 depicts a block diagram of a processing system including one or more IC chips, according to embodiments.

Referring now to FIG. 4, shown is a high-level block diagram of an example computer system 501 that may include one or more multi-chip packages or IC chips, in accordance with embodiments of the present disclosure. In some embodiments, the major components of the computer system 501 may comprise one or more CPUs 502 (e.g., first IC chip 112 or second IC chip 114 shown in FIG. 1), a memory subsystem 504, a terminal interface 512, a storage interface 516, an I/O (Input/Output) device interface 514, and a network interface 518, all of which may be communicatively coupled, directly or indirectly, for inter-component communication via a memory bus 503, an I/O bus 508, and an I/O bus interface 510.

The computer system 501 may contain one or more general-purpose programmable central processing units (CPUs) 502A, 502B, 502C, and 502D, herein generically referred to as the CPU 502 (these may also be the first IC chip 112 and second IC chip 114 shown in FIG. 1). In some embodiments, the computer system 501 may contain multiple processors typical of a relatively large system; however, in other embodiments the computer system 501 may alternatively be a single CPU system. Each CPU 502 may execute instructions stored in the memory subsystem 504 and may include one or more levels of on-board cache. In some embodiments, a processor can include at least one or more of, a memory controller, and/or storage controller.

System memory subsystem 504 may include computer system readable media in the form of volatile memory, such as random-access memory (RAM) 522 or cache memory 524. Computer system 501 may further include other removable/non-removable, volatile/non-volatile computer system data storage media. By way of example only, storage system 526 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory subsystem 504 can include flash memory, e.g., a flash memory stick drive or a flash drive. Memory devices can be connected to memory bus 503 by one or more data media interfaces. The memory subsystem 504 may include at least one program product having a set (e.g., at least one) of program modules that are configured to carry out the functions of various embodiments.

Although the memory bus 503 is shown in FIG. 4 as a single bus structure providing a direct communication path among the CPUs 502, the memory subsystem 504, and the I/O bus interface 510, the memory bus 503 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 510 and the I/O bus 508 are shown as single units, the computer system 501 may, in some embodiments, contain multiple I/O bus interfaces 510, multiple I/O buses 508, or both. Further, while multiple I/O interface units are shown, which separate the I/O bus 508 from various communications paths running to the various I/O devices, in other embodiments some or all of the I/O devices may be connected directly to one or more system I/O buses.

In some embodiments, the computer system 501 may be a multi-user mainframe computer system, a single-user system, or a server computer or similar device that has little or no direct user interface, but receives requests from other computer systems (clients). Further, in some embodiments, the computer system 501 may be implemented as a desktop computer, portable computer, laptop or notebook computer, tablet computer, pocket computer, telephone, smart phone, network switches or routers, or any other appropriate type of electronic device.

It is noted that FIG. 4 is intended to depict the representative major components of an exemplary computer system 501. In some embodiments, however, individual components may have greater or lesser complexity than as represented in FIG. 5, components other than or in addition to those shown in FIG. 5 may be present, and the number, type, and configuration of such components may vary.

One or more programs/utilities 528, each having at least one set of program modules 530 may be stored in memory subsystem 504. The programs/utilities 528 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs/utilities 528 and/or program modules 530 generally perform the functions or methodologies of various embodiments.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-chip package structure comprising:
    a first IC chip and a second IC chip;
    a fluid conduit thermally coupled to the first IC chip and the second IC chip, and configured to circulate fluid and remove heat generated by at least one of the first IC chip and the second IC chip, the fluid conduit having a first end and a second end opposite to the first end;
    a first monopole feed connected between the first IC chip and the first end of the fluid conduit; and
    a second monopole feed connected between the second IC chip and the second end of the fluid conduit,
    wherein the first monopole feed is configured to transmit electromagnetic signals through the fluid conduit.

2. The multi-chip package structure of claim 1, wherein the second monopole feed is configured to receive the electromagnetic signals.

3. The multi-chip package structure of claim 1, wherein the fluid conduit includes a first mesh signal reflector at the first end and a second mesh signal reflector at the second end.

4. The multi-chip package structure of claim 3, wherein the first mesh signal reflector and the second mesh signal reflector include a plurality of holes.

5. The multi-chip package structure of claim 4, wherein the holes are spaced periodically at a given pitch so that the electromagnetic signals emitted from the first monopole feed at an operating frequency only propagate toward a direction of the second monopole feed.

6. The multi-chip package structure of claim 4, wherein the holes are configured and sized to reflect the electromagnetic signals and to allow a cooling fluid to flow therethrough.

7. The multi-chip package structure of claim 4, wherein the holes are arranged in rows and columns.

8. The multi-chip package structure of claim 1, further comprising:
    a first processor package connected to the first IC chip, the first monopole feed being connected to the first processor package; and
    a second processor package connected to the second IC chip, the second monopole feed being connected to the second processor package.

9. The multi-chip package structure of claim 1, wherein a cross-sectional shape of the fluid conduit is circular.

10. The multi-chip package structure of claim 1, wherein the first IC chip and the second IC are mounted on a processor card.

11. The multi-chip package structure of claim 3, further comprising:
    a first signal carrying wire connected to the first monopole feed and inserted into the fluid conduit; and
    a second signal carrying wire connected to the second monopole feed and inserted into the fluid conduit.

12. The multi-chip package structure of claim 11, wherein the first signal carrying wire is positioned at a specified distance from the first mesh signal reflector to enable the electromagnetic signals to propagate from the first end of the fluid conduit to the second end of the fluid conduit.

* * * * *